(12) United States Patent
Tsai

(10) Patent No.: US 9,768,017 B1
(45) Date of Patent: Sep. 19, 2017

(54) METHOD OF EPITAXIAL STRUCTURE FORMATION IN A SEMICONDUCTOR

(71) Applicant: UNITED MICROELECTRONICS CORPORATION, Hsinchu (TW)

(72) Inventor: Tsung-Hsun Tsai, Budai Township (TW)

(73) Assignee: UNITED MICROELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 15/071,124

(22) Filed: Mar. 15, 2016

(51) Int. Cl.
*H01L 21/02* (2006.01)
*H01L 29/66* (2006.01)

(52) U.S. Cl.
CPC .. *H01L 21/02661* (2013.01); *H01L 29/66636* (2013.01)

(58) Field of Classification Search
CPC ................ H01L 21/02661; H01L 29/66636
See application file for complete search history.

(56) References Cited

U.S. PATENT DOCUMENTS

| 5,032,217 | A | 7/1991 | Tanaka |
| 6,453,916 | B1 | 9/2002 | Tran |
| 6,643,882 | B1 | 11/2003 | Sotozaki |
| 6,683,007 | B1 * | 1/2004 | Yamasaki ................ B08B 3/02 257/E21.219 |
| 7,592,264 | B2 | 9/2009 | Christenson |
| 9,190,327 | B2 * | 11/2015 | Sui .................. H01L 21/823814 |
| 9,214,395 | B2 * | 12/2015 | Hung ................ H01L 29/66553 |
| 2006/0081180 | A1 | 4/2006 | Aoki |
| 2015/0264790 | A1 * | 9/2015 | Miyagi ..................... G03F 1/82 378/66 |

\* cited by examiner

*Primary Examiner* — Yu-Hsi D Sun
(74) *Attorney, Agent, or Firm* — Ding Yu Tan

(57) ABSTRACT

The invention provides a method of epitaxial structure formation in a semiconductor, comprising: providing a substrate; performing a dry etch to form a first recess; after performing the dry etch, performing a SPM cleaning process on the substrate by using a nozzle spraying SPM solution with an angle greater than zero and less than 45 degrees relative to the substrate; after performing the SPM cleaning process, performing a wet etch to form a second recess; after performing the wet etch, performing a pre-epi cleaning process; and growing an epitaxial structure in the second recess.

16 Claims, 6 Drawing Sheets

METHOD OF EPITAXIAL STRUCTURE FORMATION IN A SEMICONDUCTOR

FIELD OF THE INVENTION

The present invention is related to a method of epitaxial structure formation in a semiconductor, especially a method encompassing an improved cleaning process.

BACKGROUND OF THE INVENTION

The semiconductor industry has experienced exponential growth. Technological advances in semiconductor materials and designs have produced generations where each generation has smaller scales and/or higher product performances than the previous generation. In order to achieve these high densities and high product performances, a more accurate manufacturing process is required, and most importantly, a higher demand on cleaning efficiency is then desired.

In a conventional manufacturing process, a cleaning process is performed to remove particles and residues. The cleaning process is very critical to the whole manufacturing process; however, the particles/residues removal is not effective in a conventional process leading to defects and reduction in product yields and performances.

Therefore, how to improve particles/residues removal in a manufacturing process becomes the subject of the present invention.

SUMMARY OF THE INVENTION

The present invention provides a method of epitaxial structure formation in a semiconductor, comprising: providing a substrate; performing a dry etch to form a first recess; after performing the dry etch, performing a Sulfuric Peroxide Mixture (SPM) cleaning process on the substrate by using a nozzle spraying a SPM solution with an angle greater than zero and less than 45 degrees relative to the substrate; after performing the SPM cleaning process, performing a wet etch to form a second recess; after performing the wet etch, performing a pre-epi cleaning process; and growing an epitaxial structure in the second recess.

In one embodiment of the present invention, wherein the angle of nozzle spray is less than 20 degrees in the SPM cleaning process on the substrate.

In one embodiment of the present invention, wherein the nozzle swings back and forth while spraying the SPM solution.

In one embodiment of the present invention, wherein a point of impact of sprayed-out SPM solution onto the substrate is within a distance of 97% length of a radius of the substrate as measured from a center of the substrate.

In one embodiment of the present invention, wherein a length of the radius of the substrate is 150 mm.

In one embodiment of the present invention, wherein the nozzle swings symmetrically to the center of the substrate, and a point of impact or contact of sprayed-out SPM solution onto the substrate is within a distance of 145 mm from the center of the substrate.

In one embodiment of the present invention, wherein the point of impact or contact is within a distance of +/−120 mm from the center of the substrate.

In one embodiment of the present invention, wherein a point of impact or contact of the sprayed-out SPM solution onto the substrate is located on a side of the center of the substrate away from a nozzle bracket.

In one embodiment of the present invention, wherein a point of impact or contact of the sprayed-out SPM solution onto the substrate is disposed on a side of the center of the substrate at close proximity to a nozzle bracket.

In one embodiment of the present invention, wherein a point of impact or contact of the sprayed-out SPM solution onto the substrate has a shortest distance in a range of 1-10 mm to the center of the substrate.

In one embodiment of the present invention, wherein a point of impact or contact of the sprayed-out SPM solution onto the substrate has a shortest distance of 8 mm to the center of the substrate.

In one embodiment of the present invention, wherein the pre-epi cleaning process is a second SPM cleaning process by using a nozzle spraying the SPM solution with an angle greater than zero and less than 45 degrees relative to the substrate.

Accordingly, the present invention provides a method of epitaxial structure formation in a semiconductor with improved particles/residues removal efficiency. Particles/residues on the substrate and elements formed thereon can be removed during the SPM cleaning process by chemical function/action that SPM solution has weak etching ability to nitride, and on the other hand, an acute spraying angle and swinging nozzle provides physical forces for removal of particles directed from lateral sides of particles/residues in order to further improve removal rate of particles and efficiency of the SPM cleaning process. And thus, the present invention is able to provide a method of epitaxial structure formation with better product yield and performances.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a method of epitaxial structure formation in a semiconductor device, such as a MOS transistor, with improved particles/residues removal efficiency and is described more specifically with reference to the following embodiments. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application. In addition, an NMOS/PNMOS manufacturing process is used for illustration only in the following description but not intends to limit the present invention. The method provided by the present invention can be used in applications which require formation of an epitaxial structure and/or better results of a cleaning process. In addition, manufacturing steps similar to conventional method are omitted from the illustration below for the sake of brevity.

Figure 1:
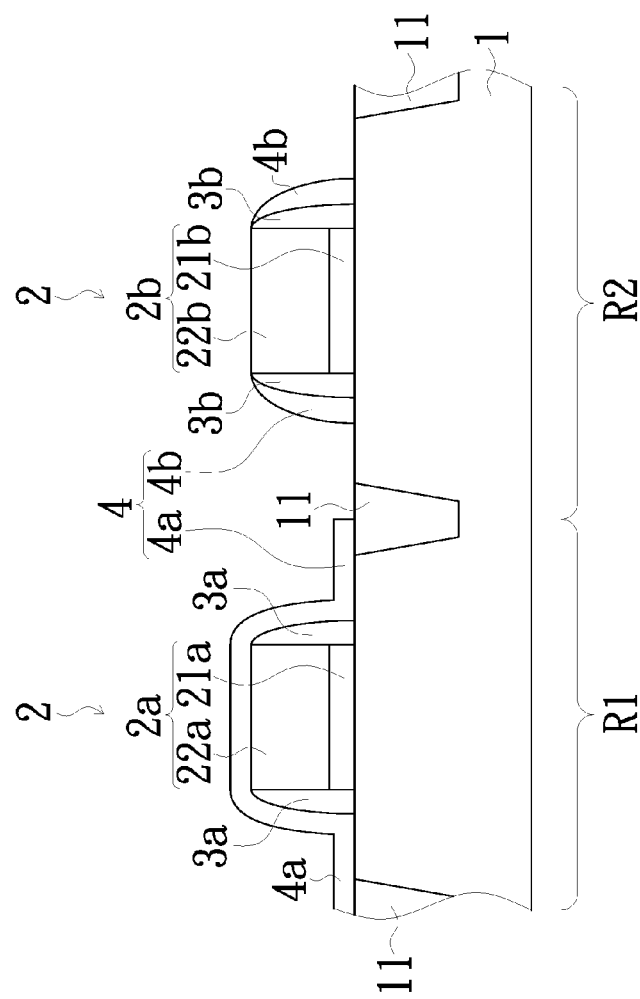
FIG. 1 is a cross-sectional view according to a step of the method provided by the present invention.

As shown in FIG. 1, a substrate 1 having an NMOS region R1 and a PMOS region R2 is provided. In the illustrated embodiment therein, the two regions R1, R2 are divided by an isolation 11 formed in the substrate 1. A plurality of gates 2 are formed on the substrate 1, wherein at least one gate structure 2a is formed in the NMOS region R1 and at least one gate structure 2b is formed in the PMOS region R2 of the substrate 1. The gate structure 2a comprises a gate dielectric layer 21a and a gate electrode 22a; and the gate structure 2b comprises a gate dielectric layer 21b and a gate electrode 22b. The gate dielectric layers 21a and 21b can be single layer or multi-layers depending on different cases or usage scenarios. A pair of spacers 3a is formed on two opposite sides of the gate structure 2a; and a pair of spacers 3b is formed on two opposite sides of the gate structure 2b. Then a nitride layer 4 is formed conformally on the substrate 1 covering the gate structures 2a and 2b and the spacers 3a and 3b. After patterning the nitride layer 4, as shown in FIG. 1, a plurality of portions 4a and 4b of the nitride layer 4 are formed (and remained). The portion 4a of the nitride layer conformally covers the substrate 1, the gate structure 2a and the spacers 3a in the NMOS region R1, and the portion 4b of the nitride layer are formed covering the spacers 3b on the sides away from the gate structure 2b.

Figure 2:
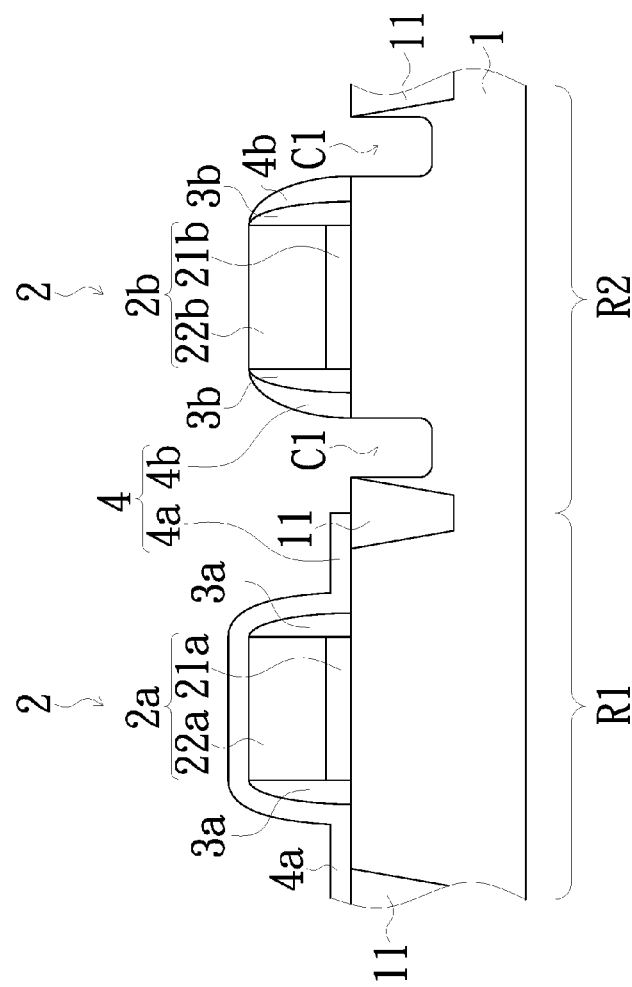
FIG. 2 is a cross-sectional view according to a step of the method provided by the present invention after the step shown in FIG. 1.

Afterward, as shown in FIG. 2, a dry etch is performed to form a first recess C1 in the PMOS region R2 of the substrate 1 using the portion 4b of the nitride layer as a mask. The first recess C1 is formed on the two opposite sides of the gate structure 2b, the spacers 3b, and the portion 4b (of the nitride layer), where (space reserved for) a source and drain are going to be formed later on.

Figure 3A:
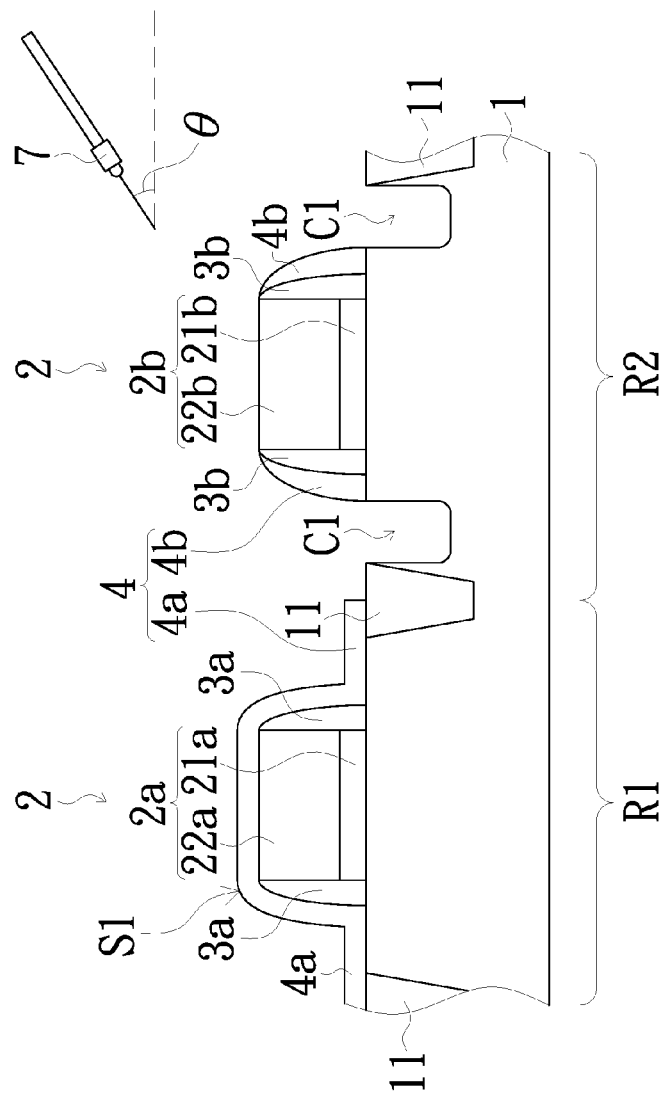
FIG. 3A is a cross-sectional view according to a step of the method provided by the present invention after the step shown in FIG. 2.
Figure 3B:
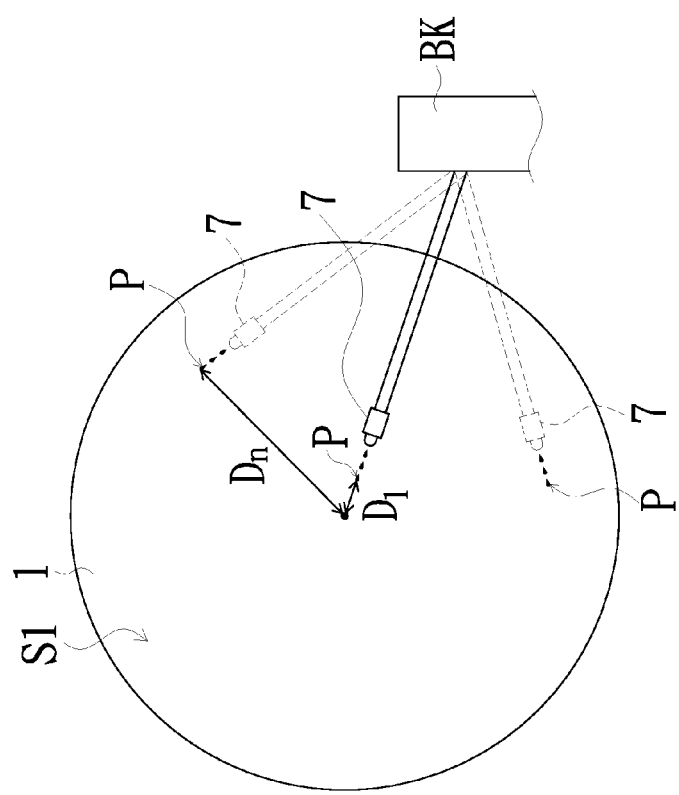
FIG. 3B is a top view according to the step as shown in FIG. 3A.

In order to enhance accuracy or quality of a wet etch after the dry etch, a sulfuric peroxide mixture (hereinafter refers to as SPM) cleaning process is performed after the dry etch and before the wet etch. A SPM solution is used in the SPM cleaning process and involves sulfuric acid ($H_2SO_4$) and hydrogen peroxide ($H_2O_2$) as conventional, and a mixture ratio of the two components can be adjusted based on different needs. In a SPM cleaning chamber (not shown), the SPM solution is jet-sprayed onto a side surface S1 of the substrate 1 (including all exposed surfaces of the substrate 1 and elements formed thereon on one side of the substrate 1) via a nozzle 7, which is capable of swinging, with an angle θ (of incline) greater than zero and less than 45 degrees relative to an extending direction of (a top surface of) the substrate 1, as shown in FIG. 3A. In a preferred embodiment, the angle θ is less than 20 degrees. Depending on different embodiment, the nozzle 7 can be only one nozzle, as shown in FIGS. 3A and 3B. In addition, in order to ensure the side surface S1 of the substrate 1 is as thoroughly cleaned as possible, the substrate 1 is being rotated/spun, clockwise or counterclockwise, in a continuous manner, and the nozzle 7 swings back and forth during the SPM cleaning process as shown in FIG. 3B. A point of impact (or point of contact) P is a point or location where the sprayed-out SPM solution hits onto the side surface S1 of the substrate 1. There is only one point of impact P at a certain given point in time, however, due to the nozzle 7 swinging motion, the nozzle 7 produces a plurality of points of impact P during the SPM cleaning process (i.e. the point of impact is changed during the SPM cleaning process by having the nozzle swinging back and forth). A distance between the point of impact P of the sprayed-out SPM solution onto the side surface S1 and a center of the substrate 1 can be varied. A shortest distance $D_1$ is greater than zero, preferably in a range of 1-10 mm, and a longest distance $D_n$ is about or less than 97% of total length of a radius of the substrate 1 (i.e. at least 3% of total radius of the substrate 1 for the edge that is not directly impacted during SPM cleaning process). For example, in an embodiment of the present invention, a substrate 1 having a diameter of 300 mm (which equates to a radius of 150 mm) is used, the nozzle 7 swings symmetrically to the center of the substrate 1 in a range of the distance $D_n$ about +/−145 mm symmetrically to the center of the substrate 1, and the point of impact P has a shortest distance $D_1$ at about 8 mm from the center of the substrate 1. In another embodiment of the present invention, a substrate 1 having a diameter of 300 mm (radius of 150 mm) is used, the nozzle 7 swings symmetrically to the center of the substrate 1 in a range of the distance $D_n$ at about 120 mm from the center of the substrate 1, and the point of impact P has a shortest distance $D_1$ at about 6 mm from the center of the substrate 1. The nozzle 7 is held via a nozzle bracket BK; although FIG. 3B shows the point of impact P is in-between the center of the substrate 1 and the nozzle bracket BK, in other embodiments, the center of the substrate 1 is in-between the point of impact P and the nozzle bracket BK.

The SPM solution is jet-sprayed with an angle θ (of incline) greater than zero and less than 45 degrees relative to an extending direction (of a top surface) of the substrate 1 in order to remove particles/residues effectively by not just chemical action/function but also intensified physical action/function. The SPM solution is avoided from hitting the center of the substrate 1 in order to minimize static electrical effect on the side surface S1 of the substrate 1. In addition, the SPM solution is avoided from hitting edges of the substrate 1 to minimize random splashing and mist production during the SPM cleaning process to reduce chances of re-attaching of (airborne or) floating particles/residues. Therefore, particles/residues removal of the SPM cleaning process is enhanced, and unfavorable effects are minimized.

Figure 4:
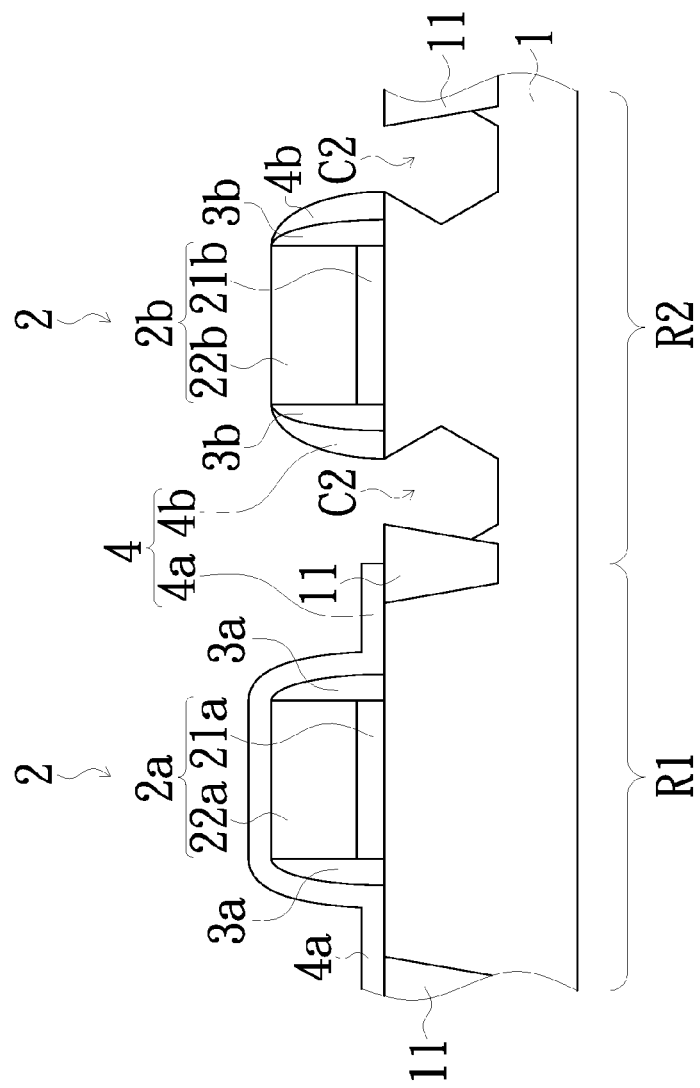
FIG. 4 is a cross-sectional view according to a step of the method provided by the present invention after the step shown in FIGS. 3A and 3B.

As shown in FIG. 4, the wet etch is performed on the first recess C1 after the SPM cleaning process to form a second recess C2. And the second recess C2 is substantially hexagonal in shape due to crystalline phase/structure and directions of the substrate 1. Subsequently a pre-epi cleaning process is performed after the wet etch before an epitaxial growing process is performed to remove particles/residues. The pre-epi cleaning process can be another SPM cleaning process performed in the same way as the SPM cleaning process illustrated above. In different embodiments of the present invention, the pre-epi cleaning process can use the same SPM solution, or a SPM solution with different mixture ratio of sulfuric acid ($H_2SO_4$) to hydrogen peroxide ($H_2O_2$), or a SPM solution mixing with other chemicals depending on different needs. In an embodiment of the present invention, a solution used in the pre-epi cleaning process is a mixture of SPM solution, Siconi™ etching solution, and SC1 (standard cleaning 1) solution/diluted hydrofluoric (DHF) ("/" here means "or"). In other embodiments of the present invention, the pre-epi cleaning process is performed via an acute angled (less than 90 degrees in incline) nozzle spray as illustrated in FIG. 3A, and described above, or a center-fixed nozzle spray (vertically jet-spraying the cleaning solution onto the substrate).

Figure 5:
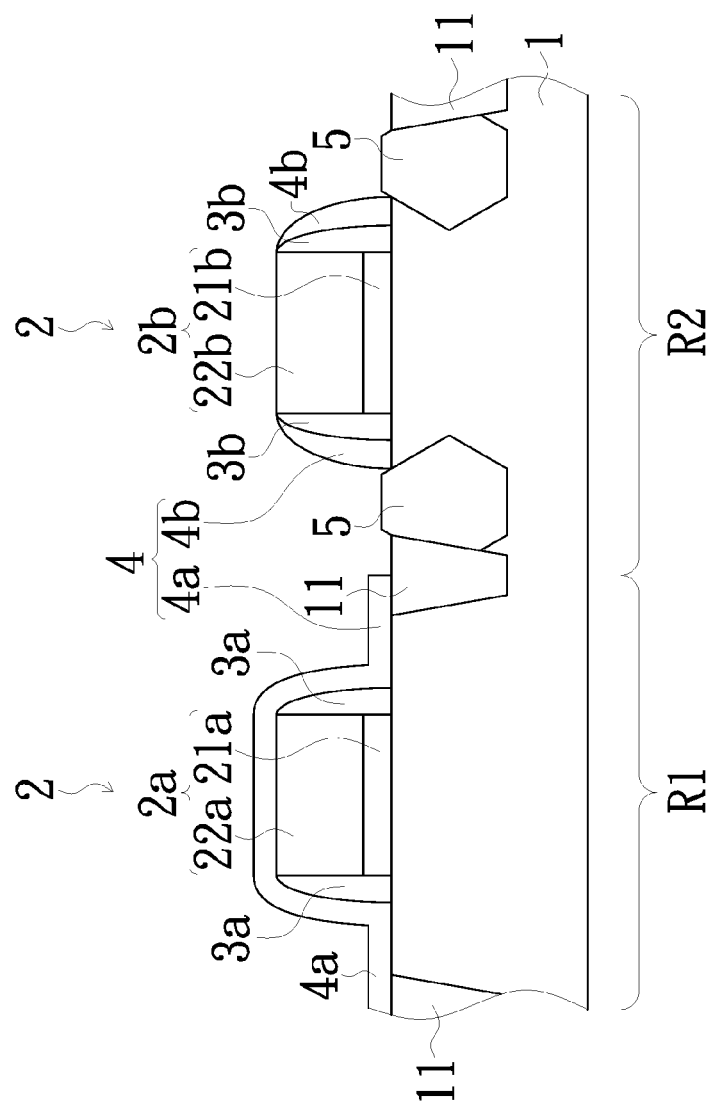
FIG. 5 is a cross-sectional view according to a step of the method provided by the present invention after the step shown in FIG. 4.

Then as shown in FIG. 5, an epitaxial structure 5 grows epitaxially in the second recess C2 to be a source/drain. The portions 4a and 4b of the nitride layer are then removed, and the NMOS region R1 of the substrate 1 is processed to form NMOS device(s) in the NMOS region R1 following the method similar to the descriptions above to form device(s) required.

Therefore, the present invention provides a method of epitaxial structure formation in a semiconductor device with improved particles/residues removal efficiency. In the embodiments above, particles/residues on the portions 4a and 4b can be removed in the SPM cleaning process by chemical action due to the fact that SPM solution has weak etching ability to nitride, and on the other hand, an acute spraying angle and swinging nozzle provides physical (removal) forces/actions directed from lateral sides of particles/residues in order to further improve removal rate of particles/residues and efficiency of the SPM cleaning process. And thus, the present invention is able to provide a method of epitaxial structure formation with better product yield and performances.

The spirit of the present invention can be applied in any cleaning step of a semiconductor manufacturing process. A top surface does not have to include nitride material, neither cleaning solution being SPM solution, and the above embodiments are for a purpose of illustration only but not intend to limit the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of epitaxial structure formation in a semiconductor device, comprising:
   providing a substrate;
   performing a dry etch to form a first recess;
   after performing the dry etch, performing a SPM cleaning process on the substrate by using a nozzle spraying a SPM solution, without directly impacting the center of the substrate during the SPM cleaning process, with an angle greater than zero and less than 45 degrees relative to the substrate;
   after performing the SPM cleaning process, performing a wet etch to form a second recess;
   after performing the wet etch, performing a pre-epi cleaning process; and
   growing an epitaxial structure in the second recess.

2. The method of epitaxial structure formation in the semiconductor device according to claim 1, wherein the angle is less than 20 degrees.

3. The method of epitaxial structure formation in the semiconductor device according to claim 1, wherein the nozzle swings back and forth while spraying the SPM solution.

4. The method of epitaxial structure formation in the semiconductor device according to claim 3, wherein a point of impact of the SPM solution sprayed onto the substrate is within a distance of 97% length of a radius of the substrate from a center of the substrate.

5. The method of epitaxial structure formation in the semiconductor device according to claim 1, wherein a radius of the substrate is 150 mm.

6. The method of epitaxial structure formation in the semiconductor device according to claim 5, wherein the nozzle swings symmetrically to the center of the substrate, and a point of impact of the SPM solution sprayed onto the substrate is within a distance of +/−145 mm from the center of the substrate.

7. The method of epitaxial structure formation in the semiconductor device according to claim 6, wherein the point of impact is within a distance of +/−120 mm from the center of the substrate.

8. The method of epitaxial structure formation in the semiconductor device according to claim 1, wherein a point of impact of sprayed-out SPM solution onto the substrate is on a side of the center of the substrate away from a nozzle bracket.

9. The method of epitaxial structure formation in the semiconductor device according to claim 1, wherein a point of impact of sprayed-out SPM solution onto the substrate is on a side of the center of the substrate close to a nozzle bracket.

10. The method of epitaxial structure formation in the semiconductor device according to claim 1, wherein a point of impact of sprayed-out SPM solution onto the substrate to the center of the substrate has a shortest distance in a range of 1-10 mm.

11. The method of epitaxial structure formation in the semiconductor device according to claim 10, wherein a point of impact of sprayed-out SPM solution onto the substrate to the center of the substrate has a shortest distance of 8 mm.

12. The method of epitaxial structure formation in the semiconductor device according to claim 1, wherein the pre-epi cleaning process is a second SPM cleaning process by using a nozzle spraying a SPM solution with an angle greater than zero and less than 45 degrees relative to the substrate.

13. The method of epitaxial structure formation in the semiconductor device according to claim 1, wherein the nozzle is only one nozzle.

14. The method of epitaxial structure formation in the semiconductor device according to claim 1, wherein a point of impact is changed during the SPM cleaning process by having the nozzle swinging back and forth.

15. The method of epitaxial structure formation in the semiconductor device according to claim 1, wherein the nozzle is capable of swinging.

16. A method of epitaxial structure formation in a semiconductor device, comprising:
   providing a substrate;
   performing a dry etch to form a first recess;
   after performing the dry etch, performing a SPM cleaning process on the substrate by using a nozzle spraying a SPM solution, without directly impacting an edge of the substrate during the SPM cleaning process, with an angle greater than zero and less than 45 degrees relative to the substrate;
   after performing the SPM cleaning process, performing a wet etch to form a second recess;
   after performing the wet etch, performing a pre-epi cleaning process; and
   growing an epitaxial structure in the second recess.

* * * * *